United States Patent [19]

Maniar et al.

[11] Patent Number: 5,356,833

[45] Date of Patent: Oct. 18, 1994

[54] PROCESS FOR FORMING AN INTERMETALLIC MEMBER ON A SEMICONDUCTOR SUBSTRATE

[75] Inventors: Papu D. Maniar; Faivel S. Pintchovski, both of Austin, Tex.

[73] Assignee: Motorola, Inc., Schaumburg, Ill.

[21] Appl. No.: 43,104

[22] Filed: Apr. 5, 1993

[51] Int. Cl.$^5$ .................. H01L 21/44; H01L 21/48
[52] U.S. Cl. ........................... 437/187; 437/246; 437/201; 437/40; 437/200; 437/196
[58] Field of Search ............. 437/187, 188, 228, 201; 156/636

[56] References Cited

U.S. PATENT DOCUMENTS

| | | | |
|---|---|---|---|
| 4,189,405 | 2/1980 | Knapton et al. | 252/462 |
| 4,423,087 | 12/1983 | Howard et al. | 427/79 |
| 4,845,050 | 7/1989 | Kim et al. | 437/188 |
| 4,920,071 | 4/1990 | Thomas | 437/188 |
| 4,944,836 | 7/1990 | Beyer et al. | 156/645 |
| 5,049,543 | 9/1991 | VanDerKolk et al. | 505/1 |
| 5,104,848 | 4/1992 | Miedema et al. | 505/1 |
| 5,122,477 | 6/1992 | Wolters et al. | 437/60 |

OTHER PUBLICATIONS

Dean; Lange's Handbook of Chemistry—Thirteenth Edition; pp. 4-62, 4-63, 4-82, 4-83, 4-90, 4-91, 4-116, 4-117, 4-132, 4-133 (1985).
Nakaishi, et al.; "Precise Reactive Ion Etching of Ta Absorber on X-Ray Masks;" Jap. J. Appl. Phys.; pp. 3065-3069 (1991).
Chou, et al.; "Platinum Metal Etching in a Microwave Oxygen Plasma," J. Appl. Phys.; vol. 68, No. 5; pp. 2415-2423 (1990).
Kuo; "Reactive Ion Etching of Sputter Deposited Tantalum with CF4, CF3Cl, and CHF3"; Jap. J. Appl. Phys.; pp. 179-185 (1993).
Curtis, et al.; "Reactive Ion Etching of Niobium in SF6/O2 to Produce Sloped Sidewall Profiles"; J. Vac. Sci. Technol. A 11(5); pp. 2846-2848 (Sep./Oct. 1993).
S. Wolf, "Silicon Processing for the VLSI Era", vol. 1, Lattice Press, Sunset Beach, Calif. 1986, pp. 535-536.
Fisher, et al.; "X-ray photolect. spectroscopy char. of the oxidation & red. of polycrystalline ZrPt &Hflr3 from 300 to 1700 K"; J. Vac. Sci. Technol. A; vol. 10, No. 4, pp. 2253-2260 (Jul./Aug. 1992).
Gibson, et al.; "Thermodynamics of Several Lewis-Acid-Base Stab. Trans. Metal Alloys"; Metallurgical Transactions A; vol. 15A, pp. 2075-2085 (1984).
Brewer, et al.; "Trans. Metal Alloys of Extraordinary Stability; An Example of Gen. Lewis-Acid-Base Interact. in Metallic Sys."; Metal. Trans.; vol. 4, pp. 83-104 (1973).
Koyama, et al.; "A Stacked Capacitor With (BaxSr1-x) TiO3 For 256M DRAM"; IEDM pp. 823-826 (1991).
Hu, et al.; "Reactive ion etching of Nb/A10x/Nb for Josephson technology"; Thin Solid Films; vol. 206, pp. 151-155 (1991).
Kuo; "Reactive Ion Etching of Sputter Deposited Tantalum Oxide & Its Etch Selectivity to Tantalum"; J. Electrochem. Soc., Inc.; vol. 139, No. 2, pp. 579-583 (Feb. 1992).
Nakaishi, et al.; "Precise Reactive Ion Etching of Ta Absorber on X-Ray Masks"; Japanese Journal of Applied Physics; vol. 30, No. 11B, pp. 3065-3069 (1991).

Primary Examiner—Tom Thomas
Assistant Examiner—L. Gurley
Attorney, Agent, or Firm—George R. Meyer

[57] ABSTRACT

The present invention includes a process for forming an intermetallic layer over a semiconductor substrate and a device formed by the process. The intermetallic layer includes a material having a molecular formula of $AB_3$, wherein A is an element having an atomic number of 39-41 or 57-73 and B is an element having an atomic of 45, 46, 77, or 78. In one process, an intermetallic member is formed by forming a patterned layer including the A or B element over a substrate, depositing a layer of the other element, and reacting them. The process forms a self-aligned member. Chemical-mechanical polishing, ion milling, and a lift-off method may be performed to pattern an $AB_3$ intermetallic layer. In a device, an intermetallic member may act as a gate electrode, an electrode of a capacitor, a conductive spacer, an interconnect, or a contact or via plug. An almost endless number of devices may be formed with the intermetallic members.

20 Claims, 5 Drawing Sheets

PROCESS FOR FORMING AN INTERMETALLIC MEMBER ON A SEMICONDUCTOR SUBSTRATE

FIELD OF THE INVENTION

The present invention relates to the field of semiconductor devices, and in particular, to processes for forming an Engel-Brewer intermetallic and devices formed by the process.

BACKGROUND OF THE INVENTION

Intermetallic materials are materials that comprise a plurality of metallic elements. As used in this specification, an Engel-Brewer intermetallic has a general molecular formula of $AB_3$, wherein A is an element having an atomic number of 1–23, 39–41, or 57–72 and B is an element having an atomic number of 26–28, 44–46, or 76–78. The Engel-Brewer intermetallics have primarily been used in the aircraft and aerospace industry. In one application, Engel-Brewer intermetallics may be used as a coating over carbon composites that may be used within turbine engines. Hot exhaust gases from the turbine engines may oxidize the carbon composites if they were not protected by the Engel-Brewer intermetallics. The intermetallics form very little, if any oxide, when they have been subjected to an $H_2/O_2$ flame at temperatures of up to 2800 degrees Celsius. In addition to oxidation resistance, the Engel-Brewer intermetallic compounds have properties that also include light weight and durability, which are both important to the use of the intermetallics within turbine engines.

Within the semiconductor industry, conductive members may act as gate electrodes, electrodes of capacitors, conductive spacers, contact or via plugs, or interconnects. As used hereinafter, "conventional conductive materials" are heavily-doped silicon, silicides, metals, and metal composites, but does not include Engel-Brewer intermetallics. The conductive members are typically made of a conventional conductive material or a combination of conventional conductive materials. The conventional conductive materials suffer from a number of problems when the materials are above a temperature of about 450° C. Some of the problems are oxidation of the conventional conductive materials, undesired interactions between various conventional conductive layers, and dopant diffusion. This list is not meant to be exhaustive. Technical literature has reported that zirconium platinide has an electrical resistivity of about 8.0 microohm-centimeters. Compare this with tungsten that has an electrical resistivity of about 7.0 microohm-centimeters. To the inventors' knowledge, Engel-Brewer intermetallics have not been used within the semiconductor industry, although at least one Engel-Brewer intermetallic is known to have a reasonably low resistivity.

SUMMARY OF THE INVENTION

The present invention includes a process for forming an intermetallic layer over a semiconductor substrate and a device formed by the process. The intermetallic layer includes a material having a molecular formula of $AB_3$, wherein A is an element having an atomic number of 39–41 or 57–73 and B is an element having an atomic number of 45, 46, 77, or 78. In one process, an intermetallic member is formed by forming a patterned layer including the A or B element over a substrate, depositing a layer of the other element, and reacting them. The process forms a self-aligned member. Chemical-mechanical polishing, ion milling, and a lift-off method may also be performed to pattern an $AB_3$ intermetallic layer if the $AB_3$ layer is deposited over all of the substrate. In a device, an intermetallic member may act as a gate electrode, an electrode of a capacitor, a conductive spacer, an interconnect, or a contact or via plug. An almost endless number of devices may be formed with the intermetallic members. The $AB_3$ intermetallics have many benefits including oxidation resistance, electromigration resistance, good adhesion to insulating layers, and resistance to dopant diffusion.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE EMBODIMENTS

The present invention includes a process for forming an intermetallic layer over a semiconductor substrate and a device formed by the process. The intermetallic layer includes a material having a molecular formula of $AB_3$, wherein A is an element having an atomic number of 39–41 or 57–73 and B is an element having an atomic number of 45, 46, 77, or 78. As described below in more detail, an intermetallic member of a patterned intermetallic layer may be formed in a self-aligned method, chemical-mechanical polishing, ion milling, and lift-off method. The patterned intermetallic layer may act as a gate electrode, an electrode of a capacitor, a conductive spacer, an interconnect, or a contact or via plug. An almost endless number of devices may be formed with the intermetallic members. The $AB_3$ intermetallic is oxidation resistant, is electromigration resistant, has good adhesion to insulating layers, and resists dopant diffusion.

EXAMPLE 1

Figure 1:
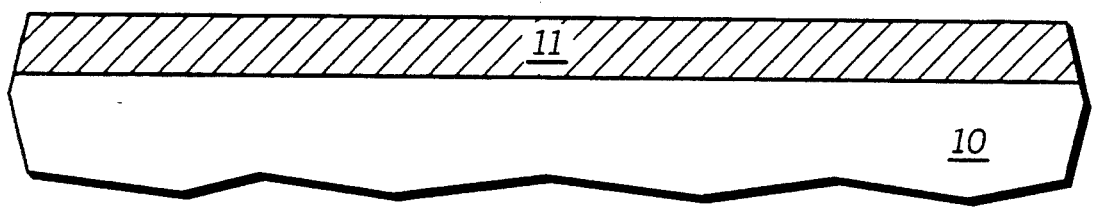
FIGS. 1–5 each include cross sectional views of a portion of a substrate at various process steps in forming a tantalum platinide member in accordance with one embodiment of the present invention.
Figure 2:
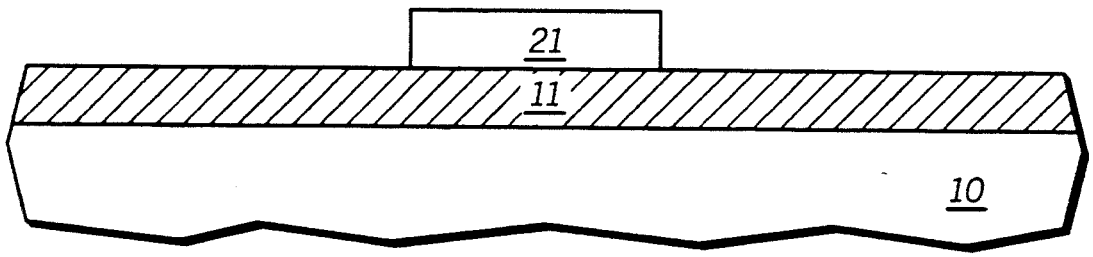
Figure 3:
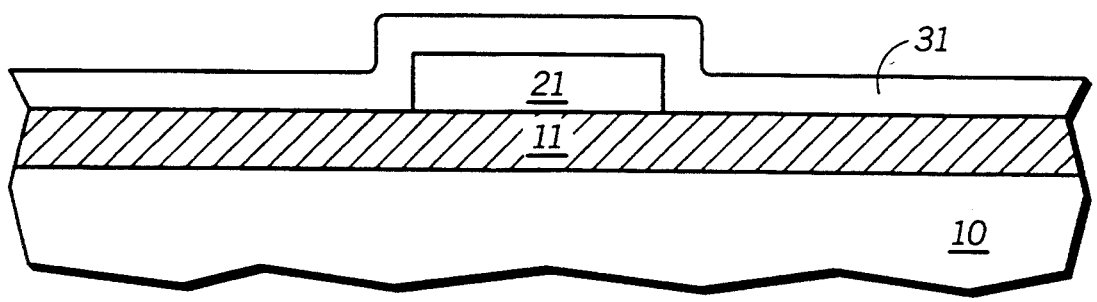

FIG. 1 includes a cross-sectional view of an insulating layer 11 lying on a silicon substrate 10. A tantalum member 21 is formed on the insulating layer 11 as shown in FIG. 2. The tantalum member 21 is formed by depositing a tantalum layer 21 about 600 angstroms thick on the insulating layer 11 and patterning the tantalum layer 21 by a lithographic method. An example of a lithographic method includes forming a masking layer having a masking member (not shown) on the tantalum layer 21. The tantalum layer 21 is then dry etched using an etching chemistry that includes a fluorine-containing or chlorine-containing material, such as $CF_3Cl$, $CHF_3$, $CF_4$, $CCl_4$, $CHCl_3$, $CH_2Cl_2$, $Cl_2$, or any combination of any fluorine-containing and chlorine-containing materials. The described lithographic method is illustrative of just one type of lithographic method, and the description should not be taken as a limitation or the only lithographic method that may be practiced with the present invention. A platinum layer 31 about 1500 angstroms thick is formed on the tantalum member 21 and exposed portions of the insulating layer 11 as shown in FIG. 3.

The substrate 10 including the tantalum member 21 and the platinum layer 31 are placed in a reaction chamber of a furnace. After the substrate is placed in the reaction chamber, the reaction chamber is adjusted to the reacting conditions, which are as follows:

1) The reacting pressure is about atmospheric pressure;
2) The ambient may be an inert gas, such as nitrogen, argon, helium, and the like; and
3) The reacting temperature is in a range of about 750–900 degrees Celsius.

Figure 4:
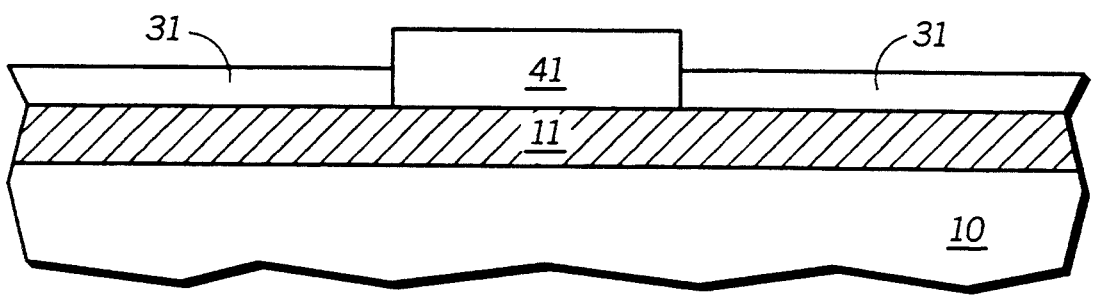
Figure 5:
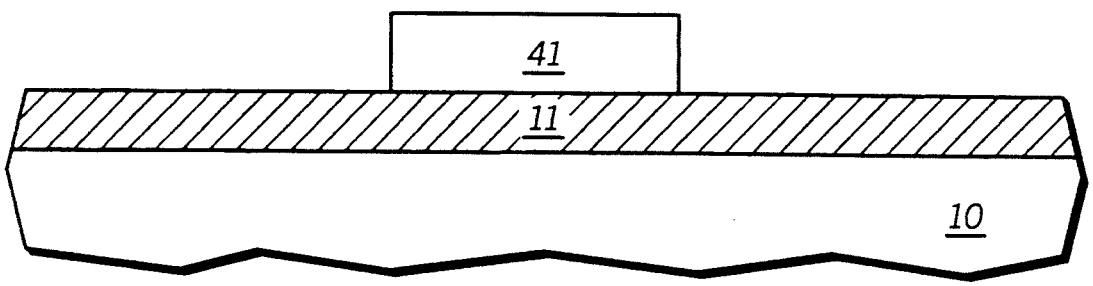

After the reaction conditions are reached, the substrate is kept at the reacting temperature for a time in a range of about 10–30 minutes. During this time, the tantalum member 21 and platinum layer 31 react to form an intermetallic member 41, which is shown in FIG. 4. All of the tantalum member 21 and part of the platinum layer 31 are consumed by the reaction to form the intermetallic member 41, which is made of tantalum platinide ($TaPt_3$). Adjacent to the intermetallic member 41 is the unreacted portion of the platinum layer 31. The substrate is placed in an aqua regia solution to remove the unreacted platinum layer 31 that lies adjacent to the intermetallic member 41 as shown in FIG. 5. The aqua regia solution is an aqueous solution that includes hydrochloric (HCl) and nitric ($HNO_3$) acids and is maintained at a temperature in a range of about 60°–100° C.

Fabricating Options

The general formula of an intermetallic formed by the present invention has a general molecular formula of $AB_3$, wherein A is yttrium, zirconium, niobium, hafnium, tantalum, or any one of the elements referred to as the "lathanides" (sometimes called the "rare earth elements") and B is rhodium, iridium, palladium, or platinum. The lathanides include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). In terms of atomic numbers, A is an element having an atomic number in a range of 39–41 or 57–73, and B is an element having an atomic number of 45, 46, 77, or 78. A material that includes at least one of the A elements is hereinafter referred to as the "A-material", and a material that includes at least one of the B elements is hereinafter referred to as the "B-material." In the Example, the A-material (tantalum) is deposited and patterned prior to depositing the B-material (platinum). In another embodiment, the B-material may be deposited and patterned prior to depositing the A-material. For example, platinum (B-material) may be dry etched using hydrogen bromide (HBr) gas. The order in which the materials are formed may be determined by the etching characteristics of the materials. For example, the material that is deposited as the first layer should be capable of being anisotropically etched to maintain dimensional control. If dimensional control is not an issue, the first layer may be either isotropically (wet or dry) or anisotropically etched. The material deposited as the second layer should be capable of being etched selectively compared to the intermetallic. In the Example, the aqua regia solution etches the unreacted platinum layer 31 at a higher etch rate compared to the etch rate of intermetallic member 41 (tantalum platinide). Therefore, the unreacted platinum layer 31 is removed selectively to the intermetallic member 41. The removal of the unreacted portion of the platinum layer 31 may be performed by a wet or dry etch, and the dry etch may be isotropic or anisotropic. Isotropic etches (wet or dry) are more likely to remove residual portions of the second layer, which are sometimes called "stringers."

The intermetallic member 41 does not need to be formed on an insulating layer, and the intermetallic member 41 may be formed on a dielectric layer, such as a gate dielectric layer, ferroelectric layer, and the like, on a semiconductor or semiconductor-containing layer, or a metallic or metal-containing layer. If the intermetallic member 41 is formed on a silicon layer, a silicide layer may be formed. Usually, the silicide layer does not cause any problems, but the thicknesses of the A-material or B-material layers may need to be adjusted to compensate for a competing silicide reaction. The intermetallic member 41 may be formed on a previously formed silicide layer. In this case, the thicknesses of the A-material or B-material layer do not need to be adjusted for a competing silicide reaction because the A-material, B-material, or intermetallic member 41 should not further react with the silicide layer.

In general, the atomic ratio for the B-material to the A-material should be 3:1 if a complete reaction of one of the layers is desired. In another embodiment, the first deposited layer may not be completely reacted. In this case, an intermetallic layer is formed along the exposed sides of the first layer. Assume that only 900 angstroms of platinum was deposited over the tantalum member 21. About 360 angstroms of the tantalum member 21 is consumed during a reaction to form an intermetallic layer. The device produced has a tantalum member 21 that is about 240 angstroms thick with an intermetallic layer lying over and along the sides of the tantalum member 21.

No known limits on thickness exist for an $AB_3$ intermetallic layer. Usually, the A-material layer is deposited to a thickness in a range of about 500–1500 angstroms, and the B-material layer is deposited to a thickness in a range of about 1500–4500 angstroms.

A variety of reacting conditions may be used. There are no known pressure limits on the reacting conditions. The reacting pressure may be near atmospheric pressure or significantly above or below atmospheric pressure. Usually, the reacting pressure is no higher than about atmospheric pressure. If the reaction is performed under vacuum, the pressure is usually less than about 1500 millitorr, and the reaction temperature may be lowered and still result in about the same rate of reaction when compared to a reaction performed at about atmospheric pressure. The reacting temperature is typically in a range of about 700°–1000° C. The ambient during the reaction should not include oxidants. The ambient may include nitrogen, hydrogen, helium, argon, or a combination thereof. The time that the substrate is kept at the reacting temperature is typically at least five minutes if a furnace is being used. Although no known upper limit for the time exists, other process considerations, such as dopant diffusions, may put a practical limit on the time.

The equipment used for the formation of the $AB_3$ intermetallic allows processing flexibility. An atmospheric furnace, a low pressure reactor, or a rapid thermal processor (RTP) may be used. The atmospheric furnace is used in Example 1. The low pressure reactor includes a low pressure chemical vapor deposition (LPCVD) system which is capable of depositing silicon, silicon dioxide, or silicon nitride. The reacting conditions are similar to those used for the atmospheric furnace except that the pressure is lower. Typically, the LPCVD system would have a reacting pressure in a range of about 100–1000 millitorr. The time at the reacting temperature would be about the same as the atmospheric furnace. An RTP may be used either at atmospheric pressure to under vacuum. The reacting conditions of the RTP would be similar to either the atmospheric furnace or the LPCVD system. With an RTP, the time at the reacting conditions is typically in a range of about 20–300 seconds.

In an alternate embodiment, the unreacted portion of the platinum layer 31 may be further patterned, in which case only part of the unreacted portion of the platinum layer 31 is removed. If the platinum layer 31 is further patterned, the complete removal of the unreacted portion of the platinum layer 31 is not performed. Depending on the application used, all or part of the unreacted portion of platinum layer 31 is removed.

An intermetallic member including $AB_3$ may be formed over a substrate using another embodiment. Assume that a patterned insulating layer is formed over the substrate. The patterned insulating layer may include an opening or a channel within the patterned insulating layer. An $AB_3$ layer is sputter deposited using a composite target that is made of $AB_3$. The $AB_3$ layer deposits on the patterned insulating layer and within any openings and channels that may be present within the patterned insulating layer. The thickness of the deposition is at least enough to completely fill all of the openings and channels that may be present within the patterned insulating layer. A step is performed to remove the $AB_3$ layer that lies on the patterned insulating while leaving the $AB_3$ layer within the openings and channels. A chemical-mechanical polishing step may be used to accomplish this. A polishing step should have a selectivity as close to 1:1 (polishing rate of the $AB_3$ layer to the polishing rate of the insulating layer) as possible because of $AB_3$'s expected resistance to attack by many chemicals. The polish slurry should have abrasive particles that may include alumina ($Al_2O_3$), silicon dioxide ($SiO_2$), titanium dioxide ($TiO_2$), zirconium dioxide ($ZrO_2$), cerium dioxide ($CeO_2$), or a combination thereof. Because a relatively non-selective polishing method would be used, the abrasive particles will usually be alumina or cerium dioxide. The polishing slurry may have nitric or hydrochloric acids and have a pH in a range of about 2–5. Still, other slurries with different types of particles and a pH outside the range previously mentioned may be used. Another removal step may include ion milling or a lift-off method instead of chemical-mechanical polishing. Using any of the three removal methods, some of the patterned insulating layer is typically removed. Therefore, the insulating layer is initially formed so that it may lose some thickness during polishing or ion milling without adversely affecting the device performance. Chemical-mechanical polishing and ion milling typically cannot be used to form a gate electrode because of a potential risk of damaging a substrate that lies below a gate dielectric layer.

The present invention may be used with any semiconductor substrate including silicon, germanium, III–V semiconductors, and insulators including sapphire. The present invention may be used with devices including MOSFET, bipolar, or BiCMOS devices. The intermetallic members may act as gate electrodes, interconnects, contact or via plugs, interconnects, and electrodes for capacitors. A devices formed using the intermetallic members include a transistor, capacitor, random access memory cell (static, dynamic, or nonvolatile), or any type of read-only-memory cell. This list is intended to be illustrative and not limiting. The present invention is not limited by design rules, and may be used with design rules below 1.0 micron and even 0.25 micron. If the intermetallic is formed by a reaction, volume changes due to the reaction may need to be taken into account. The volume changes may be predicted by the density of the materials, and the thickness of the intermetallic layer that is being formed.

Benefits

The present includes many benefits. Prior to this specification, one of the biggest problems with using an $AB_3$ compound has been related to its patterning. In the embodiment of the Example 1, patterning is performed such that the intermetallic member 41 is formed in a self-aligned method. The intermetallic member 41 is formed only where the platinum layer 31 reacts with the tantalum member 21. The shape of the intermetallic member 41 is typically determined by the shape of the tantalum member 21. The unreacted portion of the platinum layer 31 may be removed after the intermetallic member 41 is formed. Virtually none of the intermetallic member 41 is removed during the removal of any portion of the unreacted portion of the platinum layer 31. Therefore, a patterned intermetallic member 41 is formed without having to develop an etch for tantalum platinide. This self-aligned method may be used to form a gate electrode over a gate dielectric layer. It can also be used virtually any time an intermetallic member needs to be formed, such as electrodes of capacitors, conductive spacers, contact plugs, via plugs, interconnects, and the like. It is pointed out that any of the components listed in the previous sentence may comprise a combination of an $AB_3$ intermetallic and at least one other conventional conductive material. For example, a gate electrode may include a polysilicon layer and an $AB_3$ intermetallic layer, or an interconnect may include an $AB_3$ intermetallic layer and a copper or aluminum layer. These are just a couple of examples to illustrate and should not be taken as limiting.

The intermetallics of the present invention are highly oxidation resistant and are relatively stable at relatively high temperatures. A zirconium platinide ($ZrPt_3$) material was subjected to a 750 degrees Celsius oxidation for three hours without oxidizing the zirconium platinide material. A zirconium platinide material was also subjected to an $H_2/O_2$ flame for 60 seconds at temperatures up to about 2800 degrees Celsius without affecting the zirconium platinide material. Zirconium platinide and hafnium iridide (HfIr$_3$) materials only partially react with water vapor up to 1700 degrees Kelvin and forms a surface oxide layer no thicker than approximately 35 angstroms. The tests that appear in this paragraph were not performed by the inventor but are results others have achieved as reported in technical articles. The oxidation resistance and high temperature stability of an intermetallic member allows it to be formed relatively early in a process flow without having to worry about the intermetallic member becoming oxidized or unstable during subsequent oxidation and thermal cycles. The intermetallic member may act as a gate electrode for a field-effect transistor because of the intermetallic member's oxidation resistance and thermal stability.

Intermetallic members have good electrical resistivity and should have good resistance to electromigration. Technical literature has reported that zirconium platinide has an electrical resistivity of about 8.0 microohm-centimeters. Compare this with tungsten that has an electrical resistivity of about 7.0 microohm-centimeters. The intermetallics are expected to be more resistant to electromigration than aluminum, which is a common interconnecting material. The intermetallic members have good adhesion to insulating layers. Referring to Example 1, the platinum layer 31 does not adhere well to the insulating layer, but the intermetallic member 41 that includes tantalum platinide does. Dopants virtually do not diffuse through intermetallic members.

EXAMPLE 2

Figure 6:
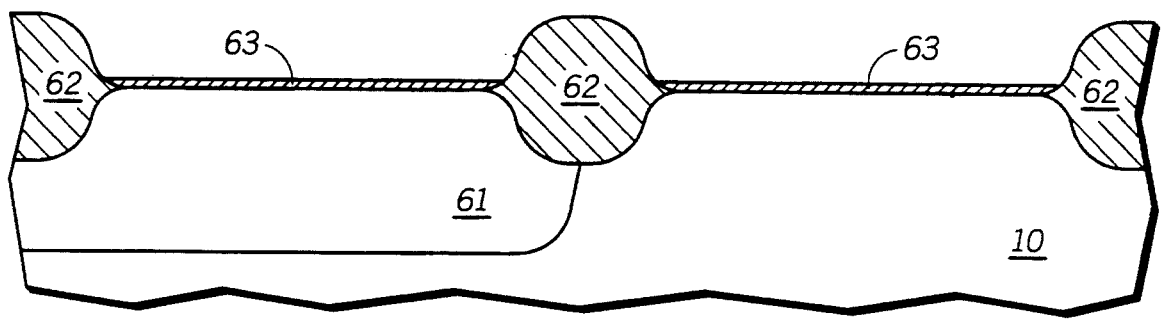
FIGS. 6–11 each include cross sectional views of a portion of a substrate at various process steps in forming a plurality of $AB_3$ members in accordance with another embodiment of the present invention.

In an alternate embodiment, a number of structures are formed that illustrate various uses of the intermetallic members in semiconductor components. FIG. 6 includes a lightly, p-type doped silicon substrate 10, an n-well region 61 within the substrate 10, field isolation regions 62, and a gate dielectric layer 63 lying on substrate 10, on n-well region 61, and between the field isolation regions 62. A niobium layer is deposited and patterned to form niobium members 71, 72, and 73 shown in FIG. 7. The patterning includes etching the niobium layer using an etching chemistry that includes Cl$_2$ or a combination of CF$_4$ and O$_2$. Sidewall spacers 74 are formed along the sides of the niobium members 71, 72 (not shown in FIG. 7), and 73 and on the gate dielectric layer 63 adjacent to the niobium members 71, 72 (not shown in FIG. 7), and 73. The sidewall spacers 74 are formed by depositing an insulating layer and anisotropically etching the insulating layer. The portions of the gate dielectric layer that are not covered by the niobium members 71, 72, and 73 and the sidewall spacers 74 is removed. A first masking layer (not shown) is formed that includes an opening that exposes niobium member 72 and its adjacent sidewall spacers 74 (not shown in FIG. 7), but the niobium members 71 and 73 and their adjacent sidewall spacers 74 are not exposed. The sidewall spacers 74 adjacent to the niobium member 72 are removed, and the portion of the gate dielectric layer 63 lying under those sidewall spacers 74 are removed. The sidewall spacers 74 are etched using a conventional isotropic etching method. If the sidewall spacers 74 and gate dielectric layer 63 are made of the same material, a single etching step may be used to remove both the sidewall spacers 74 and the gate dielectric layer 63. Otherwise, the sidewall spacers 74 and the gate dielectric layer 63 may be etched during separate etching steps. The first masking layer is removed.

Figure 7:
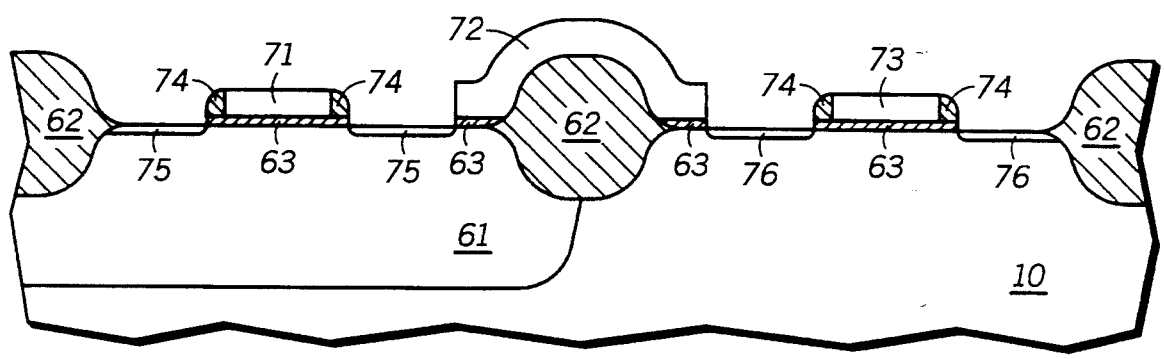

A second masking layer (not shown) is formed and includes an opening over the n-well region 61. The substrate 10 is doped with a p-type dopant to form heavily, p-type doped regions 75 within the n-well region 61. The second masking layer is removed. A third masking layer (not shown) is formed and includes an opening over the portion of the substrate 10 where the n-well region 61 is not present. The substrate 10 is doped with an n-type dopant to form heavily, n-type doped regions 76 within the substrate 10. The third masking layer is removed. FIG. 7 includes the substrate at this point in the process.

Figure 8:
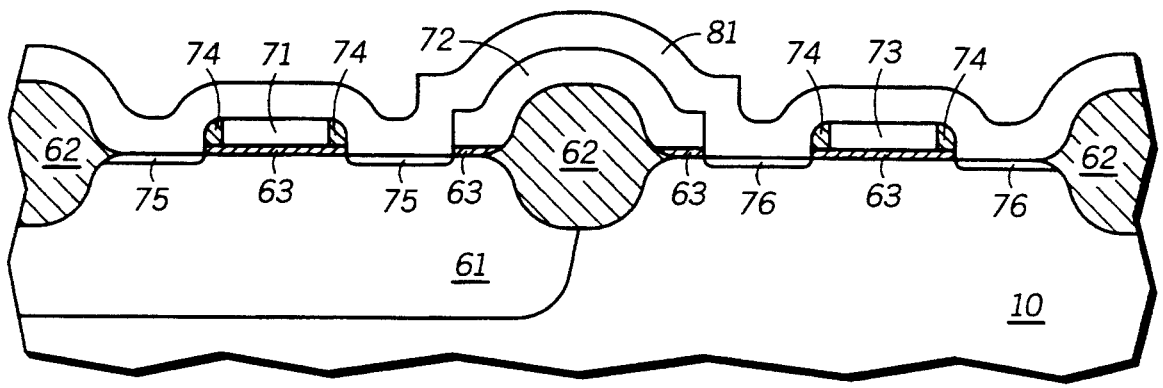
Figure 9:
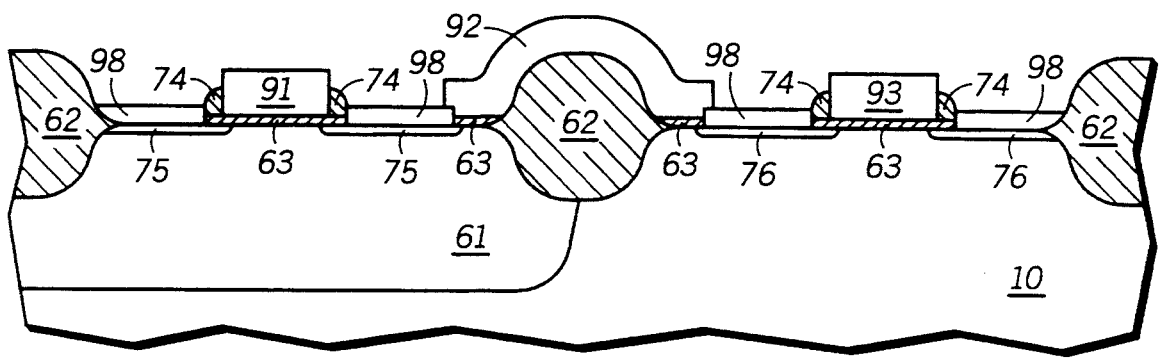

A platinum layer 81 is formed over the substrate 10 as shown in FIG. 8. The substrate 10 is annealed at about 750–900 degrees Celsius in a non-oxidizing ambient. The platinum layer 81 in contact with silicon of the heavily doped regions 75 and 76 forms a platinum silicide layer 98 on the doped regions, and the platinum layer 81 in contact with the niobium members 71–73 form intermetallic members 91–93 that include niobium platinide (NbPt$_3$). The portions of the platinum layer 81 that do not react with the substrate 10 or the niobium members 71–73 are removed using the aqua regia solution previously described. FIG. 9 includes the substrate at this point in the processing. During the anneal, the intermetallic member 92 contacts the platinum silicide layer 98 adjacent to both sides of the intermetallic member 92. Therefore, the intermetallic member 92 acts as an interconnect. The sidewall spacers 74 prevent the platinum silicide layer 98 from contacting the intermetallic members 91 and 93. The intermetallic members 91 and 93 act as gate electrodes.

Figure 10:
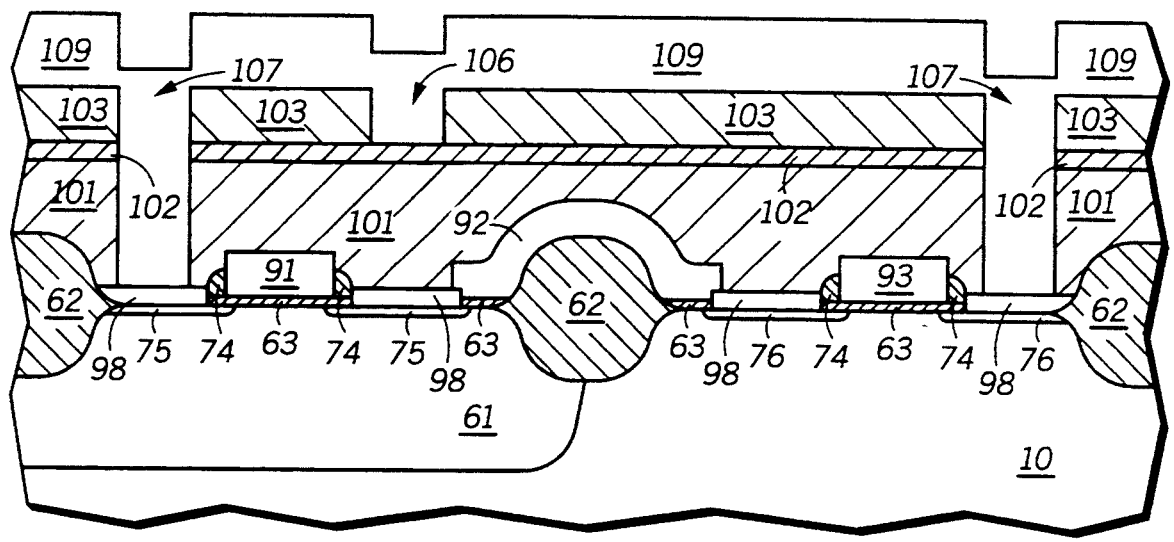
Figure 11:
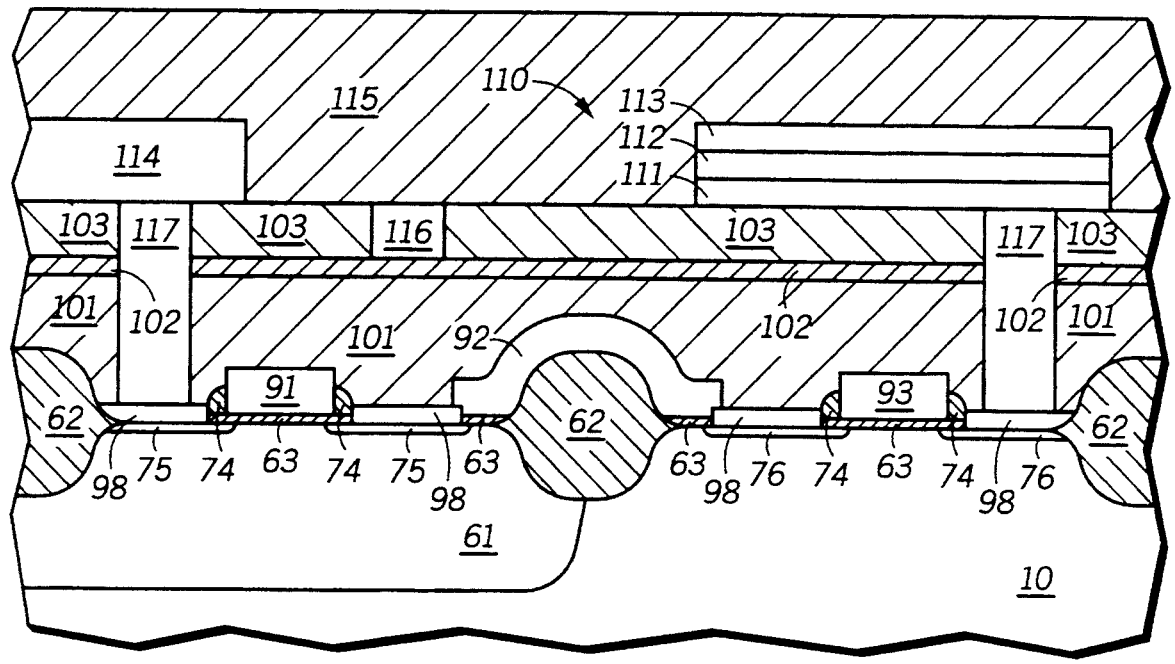

A planarized oxide layer 101, a silicon nitride layer 102, and another oxide layer 103 are formed over the substrate 10 as shown in FIG. 10. A fourth masking layer (not shown) is formed on the oxide layer 103 and includes an opening. The oxide layer 103 is etched to form an interconnecting channel 106. The silicon nitride layer 102 acts as an etch stop during the etch to form the channel 106. The fourth masking layer is removed. A fifth masking layer (not shown) is formed and includes openings over one of the p-type regions 75 and one of the n-type regions 76. The portions of all three layers 101–103 that underlie the mask openings are etched to form contact openings 107 that extend to the underlying doped regions 75 and 76. A lanthanum rhodide (LaRh$_3$) layer 109 is sputter deposited over the substrate 10 to a thickness that fills the channel 106 and the contact openings 107 as shown in FIG. 10. The sputter deposition is performed using a composite target made of lanthanum rhodide. The substrate 10 is chemically-mechanically polished to remove that portion of the lanthanum rhodide layer 109 that lies on the oxide layer 103 to form an intermetallic interconnect 116 within the interconnecting channel and intermetallic contact plugs 117 within the contact openings as illustrated in FIG. 11. The interconnect 116 does not make electrical contact to any of the devices shown in FIG. 11.

An iridium member (not shown) is formed by depositing an iridium layer (not shown) on the oxide layer 103 and the interconnect 116 and the contact plugs 117. The iridium layer is etched using a fluorine-containing compound. A hafnium layer (not shown) is deposited over the substrate 10, and the substrate is annealed at about 700–950 degrees Celsius for about 10–30 minutes to form an intermetallic member 111 that includes hafnium iridide (HfIr$_3$). The unreacted portion of the hafnium layer is removed with a solution including nitric and hydrochloric acids. Because hafnium may be more etch resistant that platinum, the solution used to etch hafnium may have a higher acid concentration or have a higher temperature during the etch. The intermetallic member 111 makes electrical contact to one of the doped regions 76 via one of the contact plugs 117 and the platinum silicide layer 98 that lies between the contact plug 117 and the doped region 76.

A dielectric layer 112 and a zirconium layer (not shown) are sequentially deposited over the substrate 10 including intermetallic member 111. A sixth masking layer including a masking member (both not shown) are formed and lies on the zirconium layer. The masking member has a shape that is substantially the same shape as the intermetallic member 111 as seen from a top view of the substrate. The position of the masking member is such that the masking member lies virtually coincident with the intermetallic member 111. A two-step etch sequence is performed to pattern the zirconium layer and the dielectric layer 112. During the first step, a chlorine-containing compound, such as $Cl_2$, $CCl_4$, $CFCl_3$, and the like, is used to etch the zirconium layer to form a zirconium member (not shown). After the zirconium layer is etched, the dielectric layer 112 is etched using a conventional etching method. A palladium layer (not shown) is deposited over the substrate 10. The substrate 10 is annealed at about 750–900 degrees Celsius for a time in a range of about 10–30 minutes to form intermetallic member 113, which includes zirconium palladide ($ZrPd_3$). The unreacted portion of the palladium layer (not shown) is removed in an aqua regia solution similar to the one used in removing the unreacted portion of the platinum layer 31 in Example 1. Referring to FIG. 11, a capacitor 110 has been formed and includes intermetallic members 111 and 113 that act as electrodes and the dielectric layer 112 lying between them.

An interconnect 114 is formed by depositing and patterning an aluminum layer. The interconnect 114 makes electrical contact to one of the doped regions 75 via one of the contact plugs 117 and the platinum silicide layer 98 that lies between that contact plug 117 and the doped region 75. A passivation layer 115 is formed over the substrate including the capacitor 110 and interconnect 114. FIG. 11 includes a substantially finished device. Electrical connections are made to the intermetallic members 91, 93, and 113, but the electrical connections are not shown in FIG. 11. If needed, other interlevel insulating layers, via openings and vias, and additional interconnecting levels may also be formed. In other embodiments, the interconnect 114 may be made of copper or the $AB_3$ compound, thereby allowing a device to be formed without any aluminum.

OTHER EXAMPLES

Figure 12:
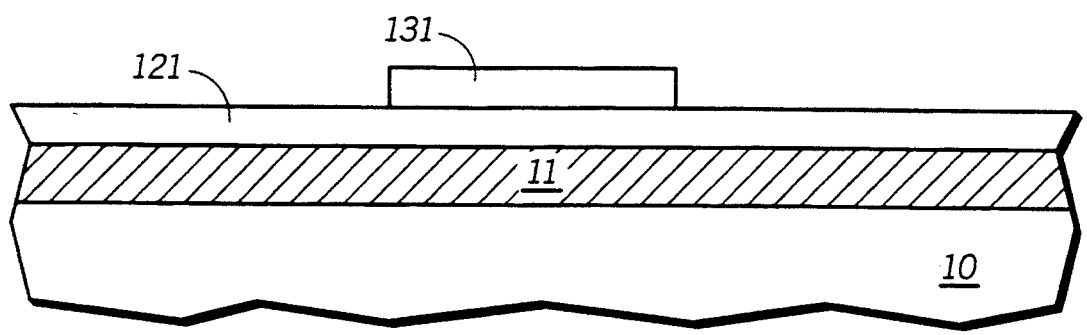
FIGS. 12–13 each include cross sectional views of a portion of a substrate at various process steps in forming an $AB_3$ member in accordance with another embodiment of the present invention.
Figure 13:
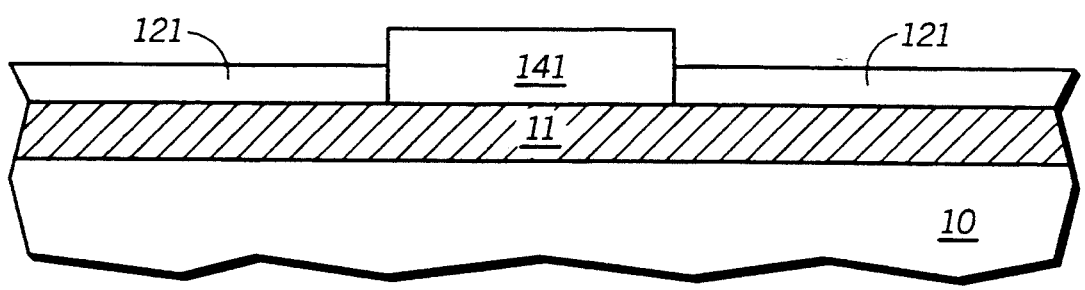

In this section, more examples are given to illustrate some alternatives. FIGS. 12 and 13 illustrate an embodiment similar to the embodiment of Example 1. FIG. 12 includes a semiconductor substrate 10 and an insulating layer 11 on the substrate 10. An A-material layer 121 is formed on the insulating layer 11, and a B-material layer 131 is formed on the A-material layer 121. The B-material is patterned in a location where an $AB_3$ intermetallic member is to be formed. Referring to FIG. 13, a reaction step similar to those previously described is performed to form the $AB_3$ intermetallic member 141. At this point, the unreacted A-material layer 121 may be further patterned or completely removed. An advantage of this embodiment is that the insulating layer 11 is not used as an etch stop when patterning the B-material layer 131 because the etch stops on the A-material layer 121. In an alternative embodiment, the B-material layer may be deposited first, and the A-material layer may be deposited and patterned over the B-material layer.

Figure 14:
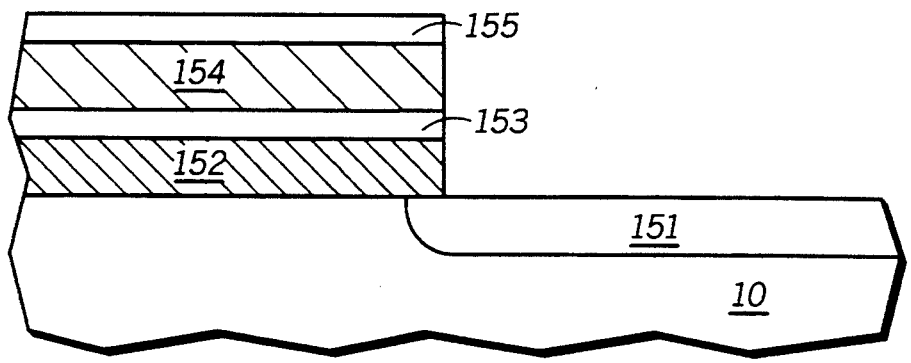
FIGS. 14–16 each include cross sectional views of a portion of a substrate at various process steps in forming an $AB_3$ member in accordance with another embodiment of the present invention.
Figure 15:
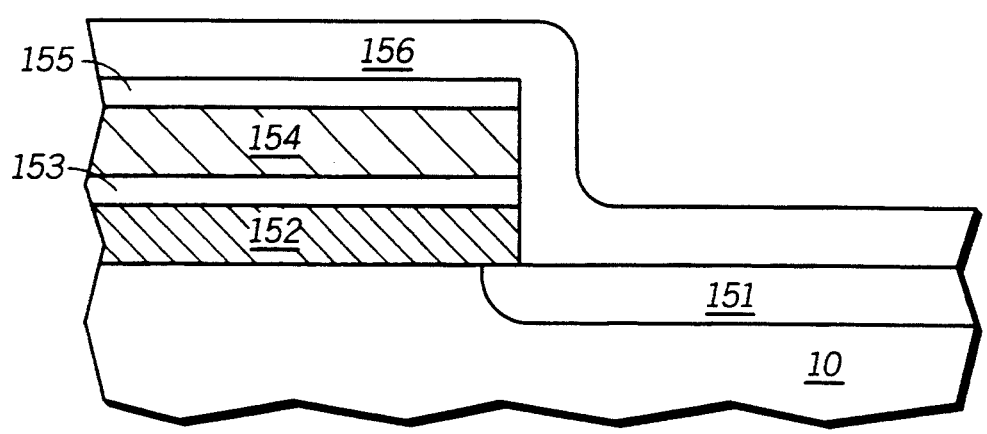
Figure 16:
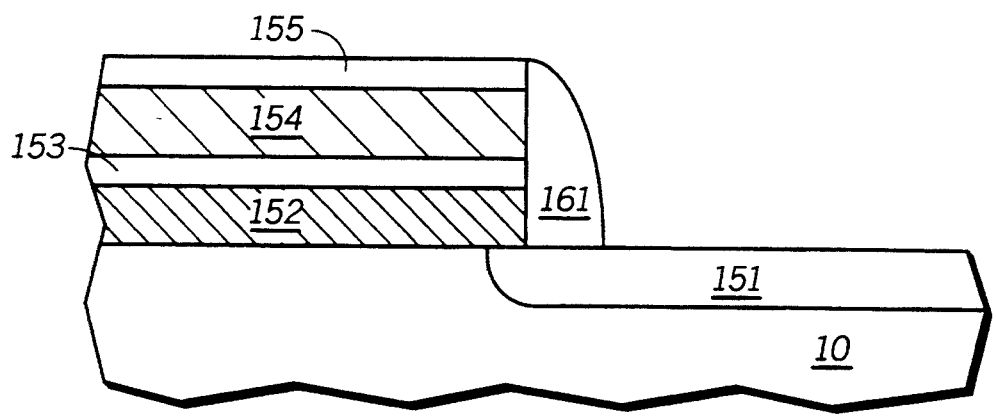

In another embodiment, a conductive spacer including an $AB_3$ intermetallic may be formed. FIG. 14 includes a silicon substrate 10 and a doped region 151. FIG. 14 further includes patterned layers 152, 153, 154, and 155 that overlie the substrate 10 and part of the doped region 151. Layers 152 and 154 are insulating layers, and layers 153 and 155 are conductive layers. An $AB_3$ intermetallic layer 156 is formed over the substrate 10 and the conductive layer 155 as shown in FIG. 15. Although FIG. 15 illustrates the $AB_3$ intermetallic layer 156 to be very conformal, the $AB_3$ intermetallic layer does not have to be very conformal. Still, some of the $AB_3$ intermetallic layer must deposit along the entire vertical edge formed by the patterned layers 152–155. An anisotropic etching method, such as ion milling, is performed to form a sidewall spacer 161 as shown in FIG. 16. Conductive layers 153 and 155 and doped region 151 are electrically connected to one another.

This embodiment with the conductive spacer 161 may be particularly useful in a static-random-access memory cell. For example, doped region 151 may act as a storage node, conductive layer 153 may act as a gate electrode for a latch transistor, and conductive layer 155 may acts as a source/drain region of a load transistor or as part of an electrical connection to a load resistor. In other applications, the conductive spacer 161 may be used to connect alternating electrodes of a stacked or fin capacitor in a static-random-access memory or a dynamic-random-access memory. Once again, the embodiment and the applications are only meant to illustrate and not to limit.

In another embodiment, the conductive layer 155 is not present, and the insulating layer 154 may or may not be present. In still another embodiment, the sidewall spacer may be formed and include the A-material. A B-material layer may be formed over the substrate including the spacer. During a reaction step, the A-material spacer would be converted to an $AB_3$ intermetallic spacer, and a silicide layer may be formed where the A or B-material reacted with the silicon within the doped region 151. Obviously, in another embodiment, a B-material spacer may be formed, and then an A-material layer is formed over the B-material spacer.

Figure 17:
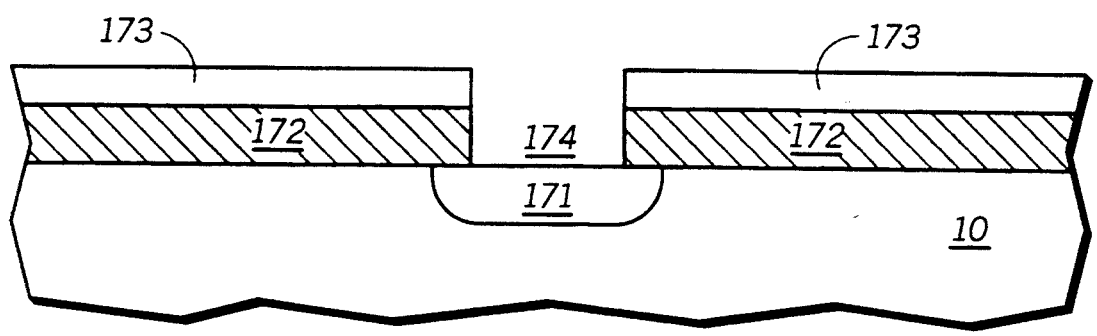
FIGS. 17–19 each include cross sectional views of a portion of a substrate at various process steps in forming an $AB_3$ member in accordance with another embodiment of the present invention.
Figure 18:
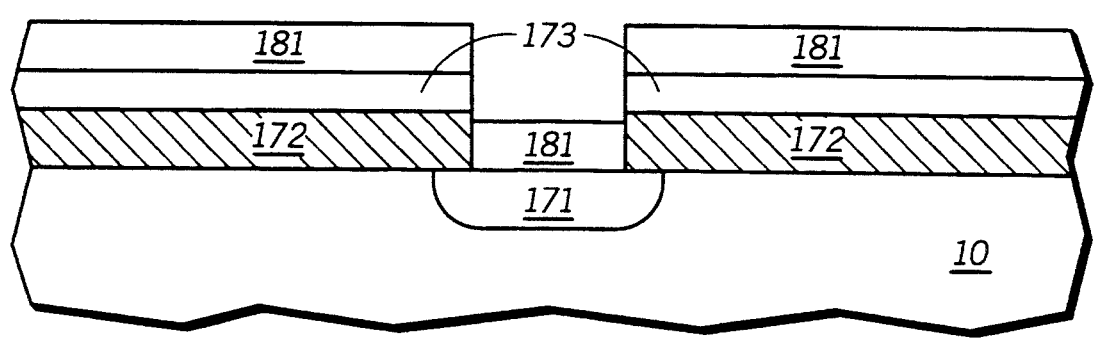
Figure 19:
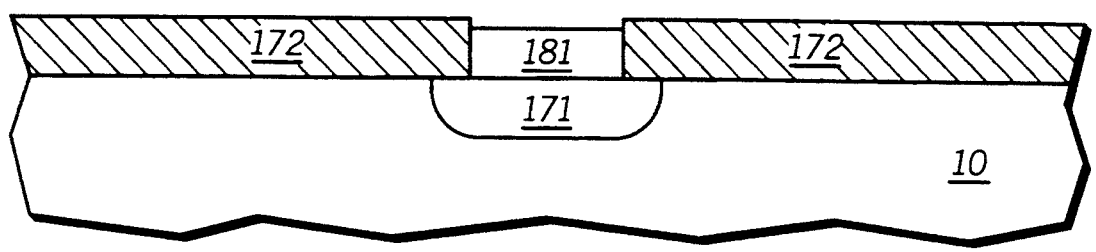

FIGS. 17–19 illustrate a type of "lift-off" method that may be used. In general, a lift-off method includes forming a patterned masking layer, depositing a different layer, and removing the patterned masking layer and that portion of the different layer lying on the patterned masking layer. FIG. 17 includes a semiconductor substrate 10 having a doped region 171. Lying over the substrate 10 and part of the doped region 171 are a patterned insulating layer 172 and a patterned photoresist layer 173. The combination of the patterned layers 172 and 173 form a contact opening 174. An $AB_3$ intermetallic layer 181 is sputter deposited over the substrate 10. As shown in FIG. 18, part of the $AB_3$ intermetallic layer 181 lies on the patterned photoresist layer 173, and part of the $AB_3$ intermetallic layer 181 lies on the doped region 171 within the contact opening 174. Very little, if any, of the $AB_3$ intermetallic layer 181 is deposited on the vertical surfaces of the patterned photoresist layer 173. The substrate 10 is then placed in an organic solvent to remove the patterned photoresist layer 173 and that portion of the AB$_3$ intermetallic layer 181 lying on the patterned photoresist layer 173 as shown in FIG. 19. Only that portion of the AB$_3$ intermetallic layer lying within the contact opening 174 remains on the substrate 10.

In the foregoing specification, the invention has been described with reference to specific embodiments thereof. It will, however, be evident that various modifications and changes may be made thereto without departing from the broader spirit or scope of the invention as set forth in the appended claims. The specification and drawings are, accordingly, to be regarded in an illustrative rather than a restrictive sense.

What is claimed is:

1. A process for forming an intermetallic member over a semiconductor substrate comprising the steps of:
   depositing a first layer over the substrate, wherein the first layer includes an element selected from a group consisting of yttrium, zirconium, niobium, lanthanum, cerium, praseodymium, neodymium, promethium, samarium, europium, .gadolinium, terbium, dysprosium, holmium, erbium, thulium, ytterbium, lutetium, hafnium, and tantalum;
   dry etching the first layer to form a patterned first layer;
   forming a second layer over the substrate, wherein the second layer includes an element selected from a group consisting of rhodium, iridium, palladium, and platinum;
   reacting the patterned first layer and the second layer to form the intermetallic member, wherein the intermetallic member includes a material having a molecular formula of AB$_3$, wherein;
   A is an element selected from a group consisting of yttrium, zirconium, niobium, lanthanum, cerium, praseodymium, neodymium, promethium, samarium, europium, gadolinium, terbium, dysprosium, holmium, erbium, thulium, ytterbium, lutetium, hafnium, and tantalum; and
   B is an element selected from a group consisting of rhodium, iridium, palladium, and platinum.

2. The process of claim 1, further comprising the step of forming a third layer over the substrate prior to the step of depositing first layer, wherein the third layer is selected from a group consisting of a dielectric material, an insulating material, a semiconductor layer, a semiconductor-containing layer, a metallic layer, and a metal-containing material.

3. The process of claim 1, wherein the step of reacting is performed:
   in a furnace;
   at about atmospheric pressure;
   at a temperature in a range of about 700–1000 degrees Celsius; and
   for a time in a range of about 10–30 minutes.

4. The process of claim 1, wherein the step of reacting is performed in a machine selected from a group consisting of a low pressure chemical vapor deposition system and a rapid thermal processor.

5. The process of claim 1, wherein the intermetallic member acts as at least part of a component selected from a group consisting of a gate electrode, an electrode of a capacitor, a conductive spacer, an interconnect, a contact plug, and a via plug.

6. The process of claim 5, wherein the intermetallic member acts as a gate electrode.

7. The process of claim 1, wherein the step of dry etching is performed using an etch chemistry including at least one of a chlorine-containing material and a fluorine-containing material.

8. The process of claim 1, wherein the first layer includes an element selected from a group consisting of zirconium, niobium, and tantalum.

9. The process of claim 1, wherein the intermetallic member includes a material selected from a group consisting of niobium platinide, zirconium platinide, and an iridium-containing material.

10. The process of claim 1, wherein:
    the step of reacting forms an unreacted portion of the second layer; and
    the unreacted portion of the second layer is removed.

11. A process for forming an intermetallic member over a semiconductor substrate comprising the steps of:
    forming a first layer over the substrate, wherein the first layer includes an element selected from a group consisting of rhodium, iridium, palladium, and platinum:
    dry etching the first layer to form a patterned first layer:
    forming a second layer over the substrate, wherein the second layer includes an element selected from a group consisting of yttrium, zirconium, niobium, lanthanum, cerium, praseodymium, neodymium, promethium, samarium, europium, gadolinium, terbium, dysprosium, holmium, erbium, thulium, ytterbium, lutetium, hafnium, and tantalum;
    reacting the patterned first layer and the second layer to form the intermetallic member, wherein the intermetallic member includes a material having a molecular formula of AB$_3$, wherein;
    A is an element selected from a group consisting of yttrium, zirconium, niobium, lanthanum, cerium, praseodymium, neodymium, promethium, samarium, europium, gadolinium, terbium, dysprosium, holmium, erbium, thulium, ytterbium, lutetium, hafnium, and tantalum; and
    B is an element selected from a group consisting of rhodium, iridium, palladium, and platinum.

12. The process of claim 11, further comprising the step of forming a third layer over the substrate prior to the step of depositing the first layer, wherein the third layer is selected from a group consisting of a dielectric material, an insulating material, semiconductor layer, a semiconductor-containing layer, a metallic layer, and a metal-containing material.

13. The process of claim 11, wherein the step of reacting is performed:
    in a furnace;
    at about atmospheric pressure;
    at a temperature in a range of about 700–1000 degrees Celsius; and
    for a time in a range of about 10–30 minutes.

14. The process of claim 11, wherein the step of reacting is performed in a machine selected from a group consisting of a low pressure chemical vapor deposition system and a rapid thermal processor.

15. The process of claim 11, wherein the intermetallic member acts as at least a part of a component selected from a group consisting of a gate electrode, an electrode of a capacitor, a conductive spacer, an interconnect, a contact plug, and a via plug.

16. The process of claim 15, wherein the intermetallic member acts as a gate electrode.

17. The process of claim 11, wherein the step of dry etching is performed using an etch chemistry including at least one of a chlorine-containing material and a fluorine-containing material.

18. The process of claim 11, wherein the first layer includes an element selected from a group consisting of iridium and platinum.

19. The process of claim 11, wherein the intermetallic member includes a material selected from a group consisting of niobium platinide, zirconium platinide, and an iridium-containing material.

20. The process of claim 11, wherein:
   the step of reacting forms an unreacted portion of the second layer; and
   the unreacted portion of the second layer is removed.

* * * * *